(12) United States Patent
Suzuki et al.

(10) Patent No.: US 7,973,844 B2
(45) Date of Patent: Jul. 5, 2011

(54) SOLID STATE IMAGE PICKUP DEVICE

(75) Inventors: Yasuhiro Suzuki, Hamamatsu (JP);
Masaki Mizoguchi, Hamamatsu (JP);
Seiichiro Mizuno, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 334 days.

(21) Appl. No.: 10/586,971

(22) PCT Filed: Jan. 21, 2005

(86) PCT No.: PCT/JP2005/000779
§ 371 (c)(1),
(2), (4) Date: May 3, 2007

(87) PCT Pub. No.: WO2005/071949
PCT Pub. Date: Aug. 4, 2005

(65) Prior Publication Data
US 2007/0242151 A1  Oct. 18, 2007

(30) Foreign Application Priority Data
Jan. 26, 2004 (JP) .............................. P2004-017423

(51) Int. Cl.
*H04N 3/14* (2006.01)
*H04N 5/335* (2006.01)

(52) U.S. Cl. ........ 348/304; 348/300; 348/301; 348/302; 348/308; 348/310; 250/208.1

(58) Field of Classification Search .......... 348/294–310; 250/208.1
See application file for complete search history.

(56) References Cited

U.S. PATENT DOCUMENTS

| 6,856,349 B1* | 2/2005 | Trevino | 348/302 |
| 2002/0186312 A1* | 12/2002 | Stark | 348/302 |
| 2003/0193594 A1* | 10/2003 | Tay | 348/308 |

FOREIGN PATENT DOCUMENTS

| EP | 1 049 171 | | 2/2000 |
| JP | 03-027684 | | 2/1991 |
| JP | 030327684 A | * | 6/1991 |
| JP | 6-178046 | | 6/1994 |
| JP | 2001-326856 | | 11/2001 |
| WO | WO 98/15115 | | 4/1998 |
| WO | 00/26966 | | 5/2000 |

* cited by examiner

*Primary Examiner* — Sinh Tran
*Assistant Examiner* — Anthony J Daniels
(74) *Attorney, Agent, or Firm* — Drinker Biddle & Reath LLP (57) ABSTRACT

The present invention relates to a solid-state image pickup apparatus which allows, when being applied as an element of a solid-state image pickup array, to reduce a non-sensitive region between the adjacent devices, and can thus obtain more accurate imaging results. The solid-state image pickup apparatus comprises a photodetecting section, an output section, a row selecting section, and a column selecting section, and further comprises M waveform shaping circuits as waveform shaping means for shaping the waveforms of row selecting signals. A row selecting signal outputted from the row selecting section is shaped by the waveform shaping circuit and is then inputted into N pixels that constitute an mth row of the photodetecting section.

5 Claims, 9 Drawing Sheets

SOLID STATE IMAGE PICKUP DEVICE

TECHNICAL FIELD

The present invention relates to a solid-state image pickup apparatus with a photodetecting section in which a plurality of pixels each including a photodiode are two-dimensionally arranged in M rows and N columns.

BACKGROUND ART

A solid-state image pickup apparatus comprises a photodetecting section in which a plurality of pixels each including a photodiode are arranged in M rows and N columns, a row selecting section that outputs a row selecting signal to select each row of the photodetecting section, and a column selecting section that outputs a column selecting signal to select each column of the photodetecting section. And, by the row selecting section and the column selecting section, electric charges generated in the photodiodes of the respective pixels are read out in order. In such a solid-state image pickup apparatus, generally, the photodetecting section is arranged in a rectangular region, the column detecting section is arranged at the side of a first side of the rectangle (first-row side or Mth-row side of the photodetecting section), and the row selecting section is arranged at the side of a second side (side that is vertical to the first side) of the rectangle.

Meanwhile, in a solid-state image pickup apparatus disclosed in Patent Document 1, a column selecting section is arranged at the first side of a rectangle in which a photodetecting section is arranged, and a row selecting section is arranged at the first side or a third side (opposite side parallel to the first side) of the rectangle. With such an arrangement of the column selecting section and the row selecting section as this, it becomes possible to reduce the solid-state image pickup apparatus in size when the solid-state image pickup apparatus is formed on a semiconductor substrate, and a non-sensitive region (region where a light incidence cannot be detected) between the photodetecting sections can be reduced when a plurality of solid-state image pickup apparatuses are juxtaposed.

Patent Document 1: Japanese Published Unexamined Patent Application No. H03-27684

DISCLOSURE OF THE INVENTION

Problem to be Solved by the Invention

The inventors have studied conventional solid-state image pickup apparatuses in detail, and as a result, have found problems as follows. Namely, the line length for a row selecting signal, which is transmitted from the row selecting section to the pixels that constitute each row of the photodetecting section, is different from one row to another. In the case that the line length for a row selecting signal from the row selecting section to the pixels that form one row of the photodetecting section is long, since the line has a large resistance value and capacitance value, the waveform of the row selecting signal inputted into the pixels that constitute the row is deteriorated. Accordingly, readout of the electric charges generated in the photodiodes of the respective pixels in the photodetecting section is different from one row to another, and there has been a problem such that accurate imaging results cannot be obtained.

In order to overcome the above-mentioned problems, it is an object of the present invention to provide a solid-state image pickup apparatus that allows, when being applied as an element of a solid-state image pickup array, to reduce a non-sensitive region between the adjacent apparatuses, and can thus obtain more accurate imaging results.

Means for Solving Problem

A solid-state image pickup apparatus according to the present invention comprises a photodetecting section, an output section, a row selecting section, a column selecting section, and a waveform shaping means. The photodetecting section has a plurality of pixels which are two-dimensionally arranged in M rows and N columns (M and N are integers of two or more) and each of which includes a photodiode and a cell switch, and a plurality of lines $L_N$ provided in accordance with the respective columns of the pixels such that the associated photodiodes of the pixels that constitute the nth column (n is an arbitrary integer of one or more but N or less) are connected to a line $L_n$ via the cell switches. The output section is arranged at a first-row side or an Mth-row side of the photodetecting section, includes N readout circuits $R_1$ to $R_N$, and N switches $SW_1$ to $SW_N$, accumulates an electric charge that flows in through the line $L_n$ into a readout circuit $R_n$, and outputs a voltage according to the amount of the accumulated electric charge from the readout circuit $R_n$ via a switch $SW_n$. A row selecting section is arranged at a first-row side or an Mth-row side of the photodetecting section, and outputs a row selecting signal $S_{A,m}$ for an instruction on switching of the cell switches in the pixels that constitute the mth row (m is an arbitrary integer of one or more but M or less) of the photodetecting section. The column selecting section is arranged at a first-row side or an Mth-row side of the photodetecting section, and outputs a column selecting signal $S_{B,n}$ for an instruction on switching of the switch $SW_n$ in the output section. The waveform shaping means shapes, for each of the rows longer in distance from the row selecting section than a predetermined distance out of the M rows of the photodetecting section, the waveform of the row selecting section $S_{A,m}$ outputted from the row selecting section, and inputs a shaped row selecting signal $S'_{A,m}$ into the cell switches of the pixels that constitute the mth row of the photodetecting section.

In the solid-state image pickup apparatus according to the present invention, the electric charges generated in the respective photodiodes of the plurality of pixels, which are two-dimensionally arranged in M rows and N columns in the photodetecting section, are accumulated, by the row selecting signal outputted from the row selecting section and the column selecting signal outputted from the column selecting section, into the readout circuit $R_n$ through the cell switches of the pixels and the line $L_n$, and voltages according to the amount of the accumulated electric charges are outputted from the readout circuit $R_n$ via the switch $SW_n$ in order. The output section, row selecting section, and column selecting section are each arranged at the first-row side or the Mth-row side of the photodetecting section. Accordingly, the line length until the row selecting signal $S_{A,m}$ that has been outputted from the row selecting section reaches the respective pixels that constitute the mth row is different from one row to another.

When no waveform shaping means is provided, the waveform of the row selecting signal inputted into the respective pixels is deteriorated, and readout of the electric charges generated in the photodiodes of the respective pixels of the photodetecting section is different from one row to another. However, the solid-state image pickup apparatus according to the present invention comprises the waveform shaping means that shapes, for each of the rows longer in distance from the row selecting section than a predetermined distance out of the M rows of the photodetecting section, the waveform of the row selecting signal $S_{A,m}$ outputted from the row selecting section. By this waveform shaping means, the shaped row selecting signal $S'_{A,m}$ is inputted into the respective pixels that constitute the mth row of the photodetecting section, and more accurate imaging results can thus be obtained.

The waveform shaping means may be provided only for each of the rows longer in distance from the row selecting section than a predetermined distance out of the M rows of the photodetecting section. The waveform shaping means may be provided for each of all rows of the photodetecting section.

In addition, it is preferable that the waveform shaping means is arranged, for each row of the photodetecting section, at one end side (one end side of the pixels constituting the row), or may be arranged, for each row of the photodetecting section, on both end sides of the row.

It is preferable that the waveform shaping means includes a logic circuit that is inputted with the row selecting section $S_{A,m}$ outputted from the row selecting section and that outputs a logic signal according to a level of the inputted row selecting signal $S_{A,m}$ as a waveform-shaped row selecting signal $S'_{A,m}$.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

Effect of the Invention

A solid-state image pickup apparatus according to the present invention allows, when being applied as an element of a solid-state image pickup array, to reduce a non-sensitive region between the adjacent apparatuses, and can thus obtain more accurate imaging results.

DESCRIPTION OF THE REFERENCE NUMERALS 1 to 5 . . . solid-state image pickup apparatus; 11 to 15 . . . photodetecting section; 20 . . . output section; 30 . . . row selecting section; 40 . . . column selecting section; $P_{1,1}$ to $P_{M,N}$ . . . pixel; $R_1$ to $R_N$ readout circuit; and $W_{1,1}$ to $W_{1,M}$, $W_{2,1}$ to $W_{2,M}$ . . . waveform shaping circuit.

BEST MODES FOR CARRYING OUT THE INVENTION

In the following, embodiments of a solid-state image pickup apparatus according to the present invention will be explained in detail with reference to FIGS. 1 to 9. In the explanation of the drawings, constituents identical to each other will be referred to with numerals identical to each other without repeating their overlapping descriptions.

First Embodiment

Figure 1:
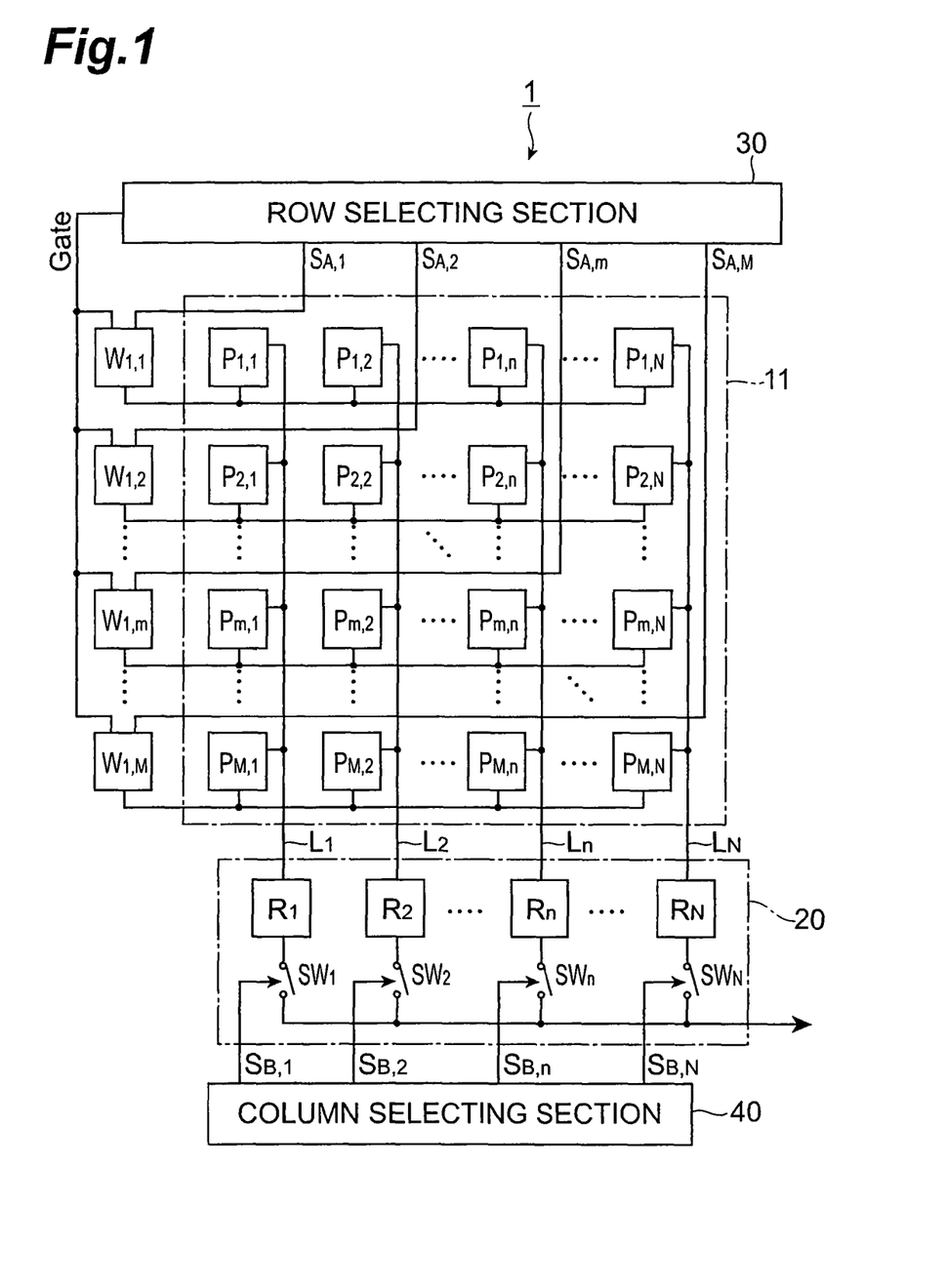
FIG. 1 is a diagram showing a configuration of a first embodiment of a solid-state image pickup apparatus according to the present invention.

First, explanation will be given of a first embodiment of a solid-state image pickup apparatus according to the present invention. FIG. 1 is a diagram showing a configuration of a solid-state image pickup apparatus 1 according to the first embodiment. The solid-state image pickup apparatus 1 shown in this figure comprises a photodetecting section 11, an output section 20, a row selecting section 30, and a column selecting section 40.

The photodetecting section 11 has M×N pixels $P_{m,n}$ that are two-dimensionally arranged in M rows and N columns and each of which includes a photodiode and a cell switch. The photodiodes in the M pixels $P_{1,n}$ to $P_{M,n}$ that constitute the nth column are connected to a common line $L_n$ via the cell switches in the pixel. Here, M and N are integers of two or more, in is an arbitrary integer of one or more but M or less, and n is an arbitrary integer of one or more but N or less. N lines $L_1$ to $L_N$ disposed between or besides the pixels are preferably as uniform as possible in a disposing distribution thereof.

The output section 20 is arranged at the Mth-row side of the photodetecting section 11, includes N readout circuits $R_1$ to $R_N$ and N switches $SW_1$ to $SW_N$, accumulates an electric charge that flows in through the line $L_n$ in the readout circuit $R_n$, and outputs a voltage according to the amount of the accumulated electric charge from the readout circuit $R_n$ via the switch $SW_n$.

The row selecting section 30 is arranged at the first-row side of the photodetecting section 11, and outputs a row selecting signal $S_{A,m}$ for an instruction on switching of the cell switches in the N pixels $P_{m,1}$ to $P_{m,N}$ that constitute the mth row of the photodetecting section 11. The column selecting section 40 is arranged at the Mth-row side of the photodetecting section 11, and outputs a column selecting signal $S_{B,n}$ for an instruction on switching of the switch $SW_n$ in the output section 20. The row selecting section 30 and column selecting section 40 each include a shift register circuit, and output a signal of the shift register circuit at each stage as a row selecting signal or a column selecting signal.

The photodetecting section 11, output section 20, row selecting section 30, and column selecting section 40 are integrated on a semiconductor substrate. And, in a layout at the time of integration, the output section 20, row selecting section 30, and column selecting section 40 are respectively arranged inside the photodetecting section 11 in terms of a pixel arrangement direction (transverse direction in the figure) of each row of the photodetecting section 11.

In addition, the solid-state image pickup apparatus 1 further comprises M waveform shaping circuits $W_{1,1}$ to $W_{1,M}$ as waveform shaping means for shaping the waveforms of row selecting signals.

Each waveform shaping circuit $W_{1,m}$ is arranged at one side (either one end side of the pixels forming the mth row) in the pixel arrangement direction of the mth row of the photodetecting section 11, shapes the waveform of the row selecting signal $S_{A,m}$ outputted from the row selecting section 30, and inputs a shaped row selecting signal $S'_{A,m}$ thereof into the cell switches in the N pixels $P_{m,1}$ to $P_{m,N}$ that constitute the mth row of the photodetecting section 11. Each waveform shaping circuit $W_{1,m}$ preferably includes a logic circuit that outputs a logic signal according to a level of the inputted row selecting signal $S_{A,m}$ as the waveform-shaped row selecting signal $S'_{A,m}$.

Figure 2:
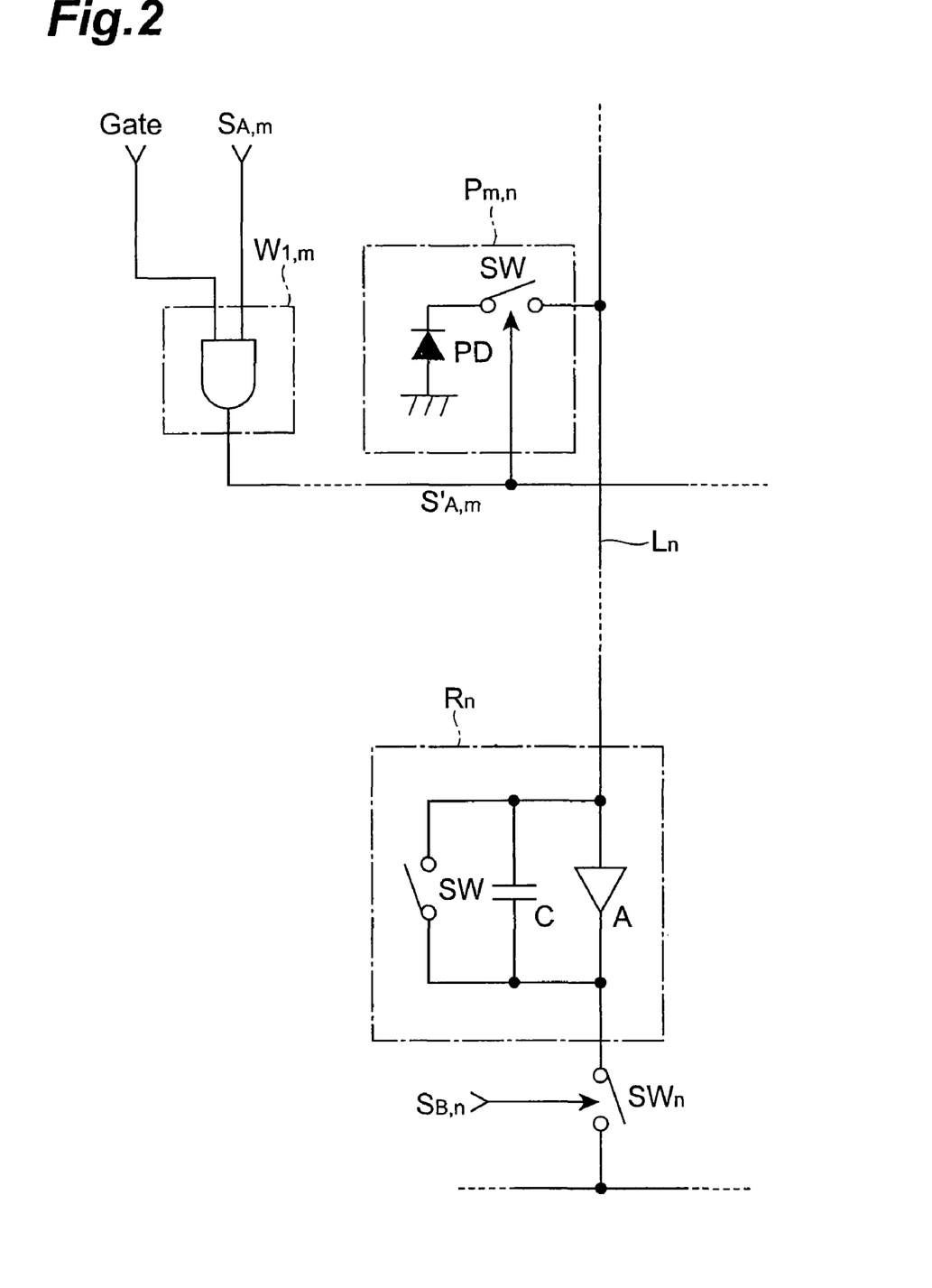
FIG. 2 is circuit diagrams of a pixel $P_{m,n}$, a readout circuit $R_n$, a switch $SW_n$, and a waveform shaping circuit $W_{1,m}$ of the solid-state image pickup apparatus 1 according to the first embodiment, respectively.

FIG. 2 is a circuit diagram of a pixel $P_{m,n}$, a readout circuit $R_n$, a switch $SW_n$, and a waveform shaping circuit $W_{1,m}$ of the solid-state image pickup apparatus 1 according to the first embodiment, respectively. Here, the respective circuits will be explained mainly on the pixel $P_{m,n}$ located in the mth row and the nth column.

The pixel $P_{m,n}$ includes a photodiode PD and a cell switch SW. An anode terminal of the photodiode PD in the pixel $P_{m,n}$ is grounded, and a cathode terminal of the photodiode PD is connected to the line $L_n$ via the cell switch SW. The cell switch SW in the pixel $P_{m,n}$ is controlled in terms of switching by the waveform-shaped row selecting signal $S'_{A,m}$ from the waveform shaping circuit $W_{1,m}$.

The readout circuit $R_n$ includes an amplifier A, a capacitive element C, and a cell switch SW. An input terminal of the amplifier A in the readout circuit $R_n$ is connected to the line $L_n$, and an output terminal of the amplifier A is connected to the switch $SW_n$. The capacitive element C and cell switch SW are mutually connected in parallel and are provided between the input and output terminals of the amplifier A. The switch $SW_n$ is connected to the output terminal of the amplifier A in the readout circuit $R_n$, and is controlled in terms of switching by the column selecting signal $S_{B,n}$ outputted from the column selecting portion 40.

As a result of closing the cell switch SW in the readout circuit $R_n$, the capacitive element C is discharged, and an output voltage from the readout circuit $R_n$ is thus initialized. During a period where the cell switch SW in the readout circuit $R_n$ is opened, an electric charge that flows in through each line $L_n$ is accumulated into the capacitive element C, and a voltage according to the amount of the accumulated electric charge is outputted from the readout circuit $R_n$. During a period where the cell switch $SW_n$ is closed, the output voltage from the readout circuit $R_n$ is outputted via the switch $SW_n$.

The waveform shaping circuit $W_{1,m}$ inputs not only the row selecting signal $S_{A,m}$ outputted from the row selecting section 30 but also a gate signal, and outputs a signal that indicates a logical product of the row selecting signal $S_{A,m}$ and the gate signal as the waveform-shaped row selecting signal $S'_{A,m}$.

Figure 3:
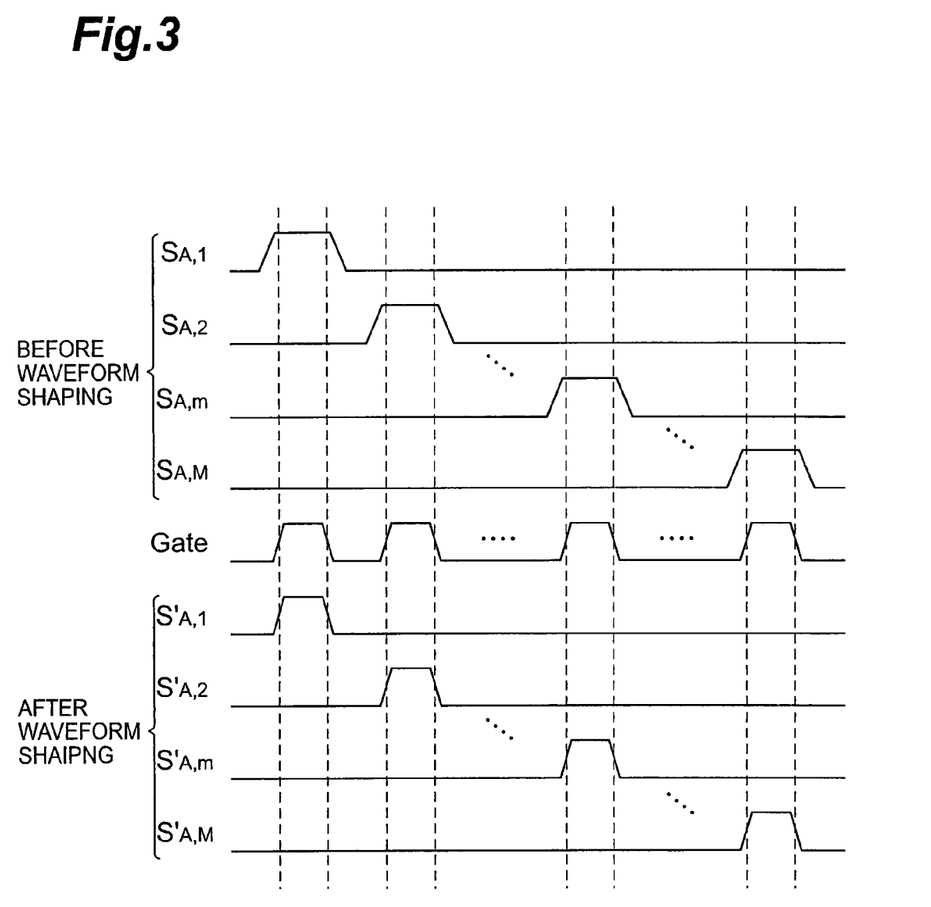
FIG. 3 is a timing chart for explaining operation of the solid-state image pickup apparatus 1 according to the first embodiment.

FIG. 3 is a timing chart for explaining operation of the solid-state image pickup apparatus 1 according to the first embodiment. In this figure, a waveform of the row selecting signal $S_{A,m}$ when this is inputted into the waveform shaping circuit $W_{1,m}$, a waveform of the gate signal when this is inputted into the waveform shaping circuit $W_{1,m}$, and a waveform of the row selecting signal $S'_{A,m}$ when this is outputted from the waveform shaping circuit $W_{1,m}$ are respectively shown.

M row selecting signals $S_{A,1}$ to $S_{A,M}$ outputted from the row selecting section 30 become high level in order. Even when the waveform of the row selecting signal $S_{A,m}$ during being outputted from the row selecting section 30 is a neat rectangular pulse waveform, the waveform of the row selecting signal $S_{A,m}$ during being inputted into the waveform shaping circuit $W_{1,m}$ can be deteriorated owing to the resistance and capacitance of the line from the row selecting section 30 to the waveform shaping circuit $W_{1,m}$.

The gate signal inputted into the waveform shaping circuit $W_{1,m}$ has a rectangular pulse waveform at a fixed interval. When any of the M row selecting signals $S_{A,1}$ to $S_{A,M}$ outputted from the row selecting section 30 is high level, the gate signal becomes high level. Accordingly, the waveform shaping circuit $W_{1,m}$ into which the row selecting signal $S_{A,m}$ and gate signal are inputted has a high-level output signal when the level of both input signals exceeds a certain threshold value. Namely, the row selecting signal $S'_{A,m}$ that is outputted from the waveform shaping circuit $W_{1,m}$ and is inputted into the cell switch SW in the pixel $P_{m,n}$ results in a waveform-shaped signal. The row selecting signal $S'_{A,m}$ that is inputted into the cell switch SW in the pixel $P_{m,n}$ of each row is preferably fixed in the pulse width.

During a period where the row selecting signal $S'_{A,m}$ that is inputted into the cell switch SW in the pixel $P_{m,n}$ is high level, the cell switch SW is closed, and an electric charge generated in the photodiode PD in the pixel $P_{m,n}$ flows into the readout circuit $R_n$ through the line $L_n$, and is accumulated into the capacitive element C in the readout circuit $R_n$. Then, as a result of the N column selecting signals $S_{B,1}$ to $S_{B,N}$ becoming high level in order, the N switches $SW_1$ to $SW_N$ are closed in order, and voltages according to the amount of the electric charges accumulated into the capacitive element C in the readout circuit $R_n$ are outputted in order via the switch $SW_n$.

Figure 4:
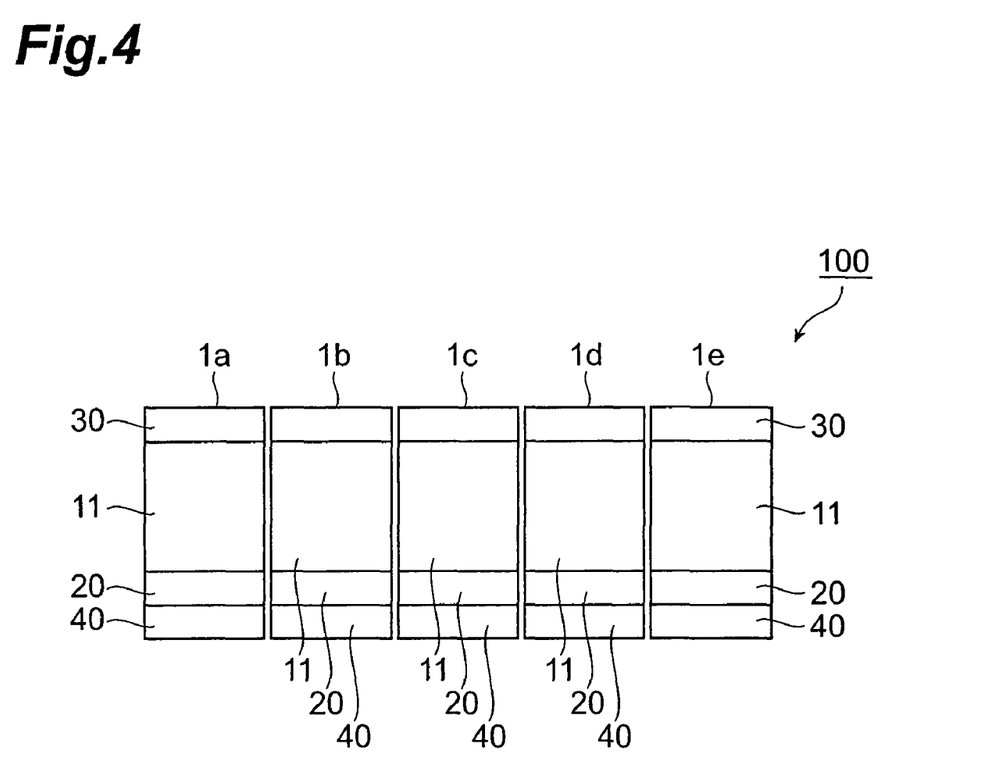
FIG. 4 is a diagram showing a configuration of a solid-state image pickup apparatus array in which a plurality of solid-state image pickup apparatuses 1a to 1e are juxtaposed.

FIG. 4 is a diagram showing a configuration of a solid-state image pickup apparatus array 100 in which a plurality of solid-state image pickup apparatuses 1a to 1e are juxtaposed. Each of the solid-state image pickup apparatuses 1a to 1e is a solid-state image pickup apparatus having the same configuration as the foregoing solid-state image pickup apparatus 1. In this solid-state image pickup apparatus array 100, the solid-state image pickup apparatuses 1a to 1e are juxtaposed so that pixels that constitute the mth row of the photodetecting section 11 of each of the solid-state image pickup apparatuses 1a to 1e are aligned in line. In other words, the first column of the photodetecting section 11 of a certain solid-state image pickup apparatus and the Nth column of the photodetecting section 11 of another solid-state image pickup apparatus are adjacent to each other. In each of the solid-state image pickup apparatuses 1a to 1e, since the row selecting section 30 is arranged at the first-row side of the photodetecting section 11 and the output section 20 and column selecting section 40 are arranged at the Mth-row side of the photodetecting section 11, when the solid-state image pickup apparatuses 1a to 1e are juxtaposed as in the solid-state image pickup apparatus array 100, it is possible to reduce a non-sensitive region between the two adjacent solid-state image pickup apparatuses.

Moreover, since the waveform shaping circuit is provided for each row so as to shape the waveform of the row selecting signal $S_{A,m}$ for selecting each row, more accurate imaging results can be obtained. In this connection, since the circuit scale of the waveform shaping circuit $W_{1,m}$ is small and the occupancy area is therefore small, a non-sensitive region that is produced as a result of providing the waveform shaping circuit $W_{1,m}$ is small.

Second Embodiment

Figure 5:
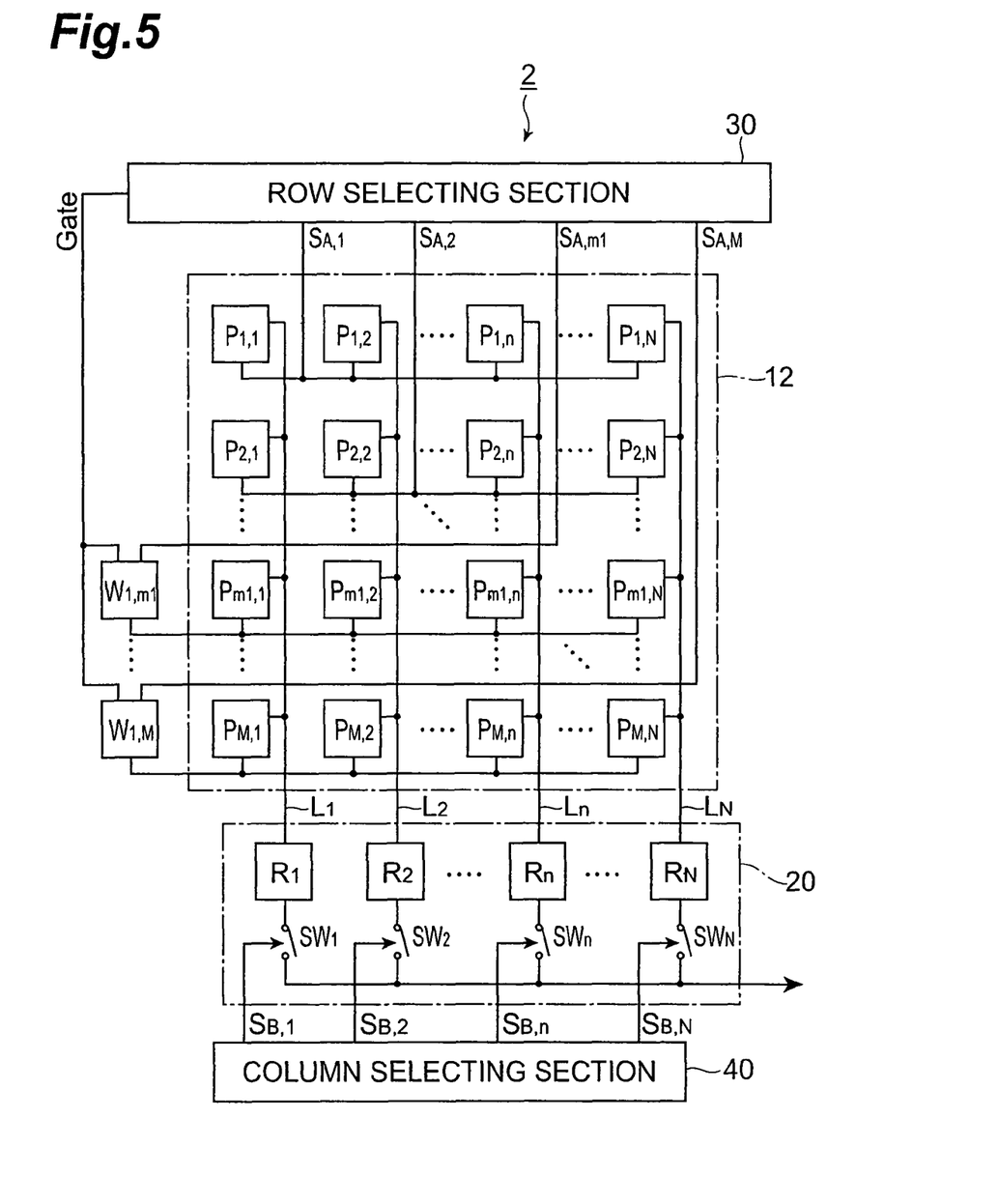
FIG. 5 is a diagram showing a configuration of a second embodiment of a solid-state image pickup apparatus according to the present invention.

Next, explanation will be given of a second embodiment of a solid-state image pickup apparatus according to the present invention. FIG. 5 is a diagram showing a configuration of a solid-state image pickup apparatus 2 according to the second embodiment. The solid-state image pickup apparatus 2 shown in this figure comprises a photodetecting section 12, an output section 20, a row selecting section 30, and a column selecting section 40.

In the solid-state image pickup apparatus 2 according to the second embodiment, each of the output section 20, row selecting section 30, and column selecting section 40 has the same components as those of the solid-state image pickup apparatus 1 according to the foregoing first embodiment.

Namely, the photodetecting section 12 of the solid-state image pickup apparatus 2 according to the second embodiment has, similar to the photodetecting section 11 of the solid-state image pickup apparatus 1 according to the foregoing first embodiment, pixels $P_{m,n}$ that are two-dimensionally arranged in M rows and N columns and each of which includes a photodiode and a cell switch, and N lines $L_N$ provided in accordance with the respective columns of the pixels such that the photodiodes in the M pixels $P_{1,n}$ to $P_{M,n}$ that constitute the nth column is connected to a common line $L_n$ via the cell switches in the pixels.

The solid-state image pickup apparatus 2 further comprises a smaller number than M of waveform shaping circuits $W_{1,m1}$ to $W_{1,M}$ as waveform shaping means for shaping the waveforms of row selecting signals. Each waveform shaping circuit $W_{1,m}$ (here, in is an integer of m1 or more but M or less) is arranged at one end side (either one end side of the pixels constituting the mth row) in the pixel arrangement direction of the mth row of the photodetecting section 12, shapes the waveform of the row selecting signal $S_{A,m}$ outputted from the row selecting section 30, and inputs a shaped row selecting signal $S'_{A,m}$ thereof into the cell switches in the N pixels $P_{m,1}$ to $P_{m,N}$ that constitute the mth row of the photodetecting section 12. Each waveform shaping circuit $W_{1,m}$ preferably includes a logic circuit that outputs a logic signal according to a level of the inputted row selecting signal $S_{A,m}$ as the waveform-shaped row selecting signal $S'_{A,m}$. In the second embodiment, the waveform shaping means, which shapes the waveform of the row selecting signal $S_{A,m}$ outputted from the row selecting section 30, is thus provided only for each of the m1th row to the Mth row longer in distance from the row selecting section 30 than a predetermined distance out of the M rows of the photodetecting section 12.

The solid-state image pickup apparatus 2 according to the second embodiment operates almost the same as the solid-state image pickup apparatus 1 according to the foregoing first embodiment. However, for each of the first row to the (m1−1)th row of the photodetecting section 12, each row selecting signal $S_{A,m}$ outputted from the row selecting section 30 is inputted into the cell switch of each of the N pixels $P_{m,1}$ to $P_{m,N}$ that constitute the mth row of the photodetecting section 12 without passing through the waveform shaping circuit. Each of the first row to the (m1−1)th row of the photodetecting section 12 is short in distance from the row selecting section 30, and is therefore small in deterioration of the waveform of the row selecting signal $S_{A,m}$ during being inputted into the cell switches in the pixels. Accordingly, the solid-state image pickup apparatus 2 according to the second embodiment provides the same effects as those of the solid-state image pickup apparatus 2 according to the foregoing first embodiment.

Third Embodiment

Figure 6:
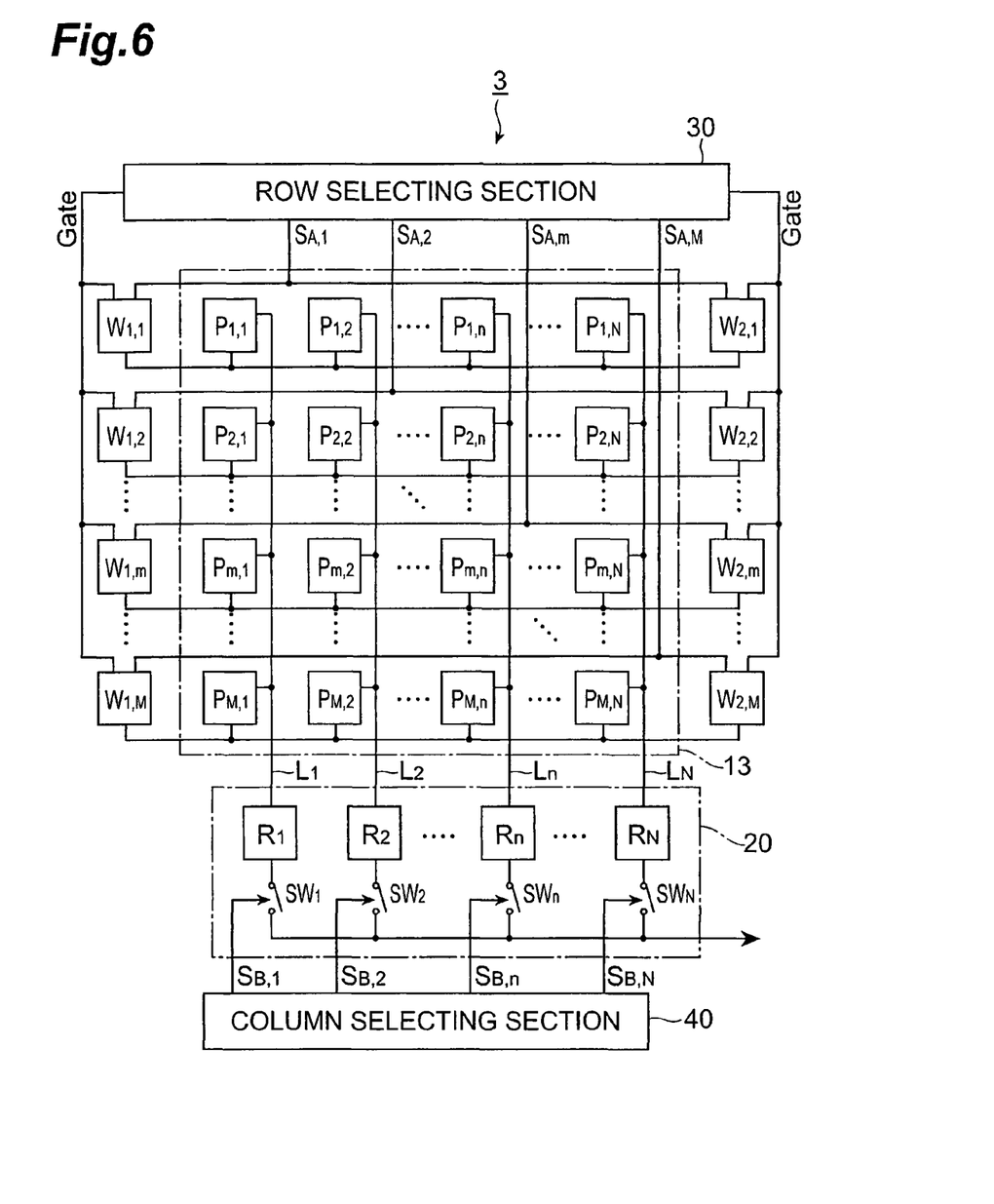
FIG. 6 is a diagram showing a configuration of a third embodiment of a solid-state image pickup apparatus according to the present invention.

Next, explanation will be given of a third embodiment of a solid-state image pickup apparatus according to the present invention. FIG. 6 is a diagram showing a configuration of a solid-state image pickup apparatus 3 according to the third embodiment. The solid-state image pickup apparatus 3 shown in this figure comprises a photodetecting section 13, an output section 20, a row selecting section 30, and a column selecting section 40.

In the solid-state image pickup apparatus 3 according to the third embodiment, each of the output section 20, row selecting section 30, and column selecting section 40 has the same components as those of the solid-state image pickup apparatus 1 according to the foregoing first embodiment.

Namely, in the solid-state image pickup apparatus 3 according to the third embodiment, the photodetecting section 13 has, similar to the photodetecting section 11 of the solid-state image pickup apparatus 1 according to the foregoing first embodiment, M×N pixels $P_{m,n}$ that are two-dimensionally arranged in M rows and N columns and each of which includes a photodiode and a cell switch, and N lines $L_N$ provided in accordance with the respective columns of the pixels such that the photodiodes in the M pixels $P_{1,n}$ to $P_{M,n}$ that constitute the nth column is connected to a common line $L_n$ via the cell switches in the pixels.

The solid-state image pickup apparatus 3 further comprises 2M waveform shaping circuits $W_{1,1}$ to $W_{1,M}$ and $W_{2,1}$ to $W_{2,M}$ as waveform shaping means for shaping the waveforms of row selecting signals. Each waveform shaping circuit $W_{1,m}$ is arranged at one end side (either one end side of the pixels forming the mth row) in the pixel arrangement direction of the mth row of the photodetecting section 13, and each waveform shaping circuit $W_{2,m}$ is arranged at the other end side (the other end side of the pixels constituting the mth row) in the pixel arrangement direction of the mth row of the photodetecting section 13. The waveform shaping circuit $W_{1,m}$ and the waveform shaping circuit $W_{2,m}$ operate with identical timing. Each waveform shaping circuit $W_{1,m}$, $W_{2,m}$ shapes the waveform of the row selecting signal $S_{A,m}$ outputted from the row selecting section 30, and inputs a shaped row selecting signal $S'_{A,m}$ thereof into the cell switches in the N pixels $P_{m,1}$ to $P_{m,N}$ that constitute the mth row of the photodetecting section 13. Each waveform shaping circuit $W_{1,m}$, $W_{2,m}$ preferably includes a logic circuit that outputs a logic signal according to a level of the inputted row selecting signal $S_{A,m}$ as the waveform-shaped row selecting signal $S'_{A,m}$.

The solid-state image pickup apparatus 3 according to the third embodiment operates almost the same as the solid-state image pickup apparatus 1 according to the foregoing first embodiment to provide the same effects. However, in the third embodiment, since the waveform shaping circuits are arranged, for each row of the photodetecting section 13, at both end sides of the row, the waveform of the row selecting signal to be inputted into the cell switches in pixels results in a neater rectangular pulse waveform, and more accurate imaging results can thus be obtained.

Fourth Embodiment

Figure 7:
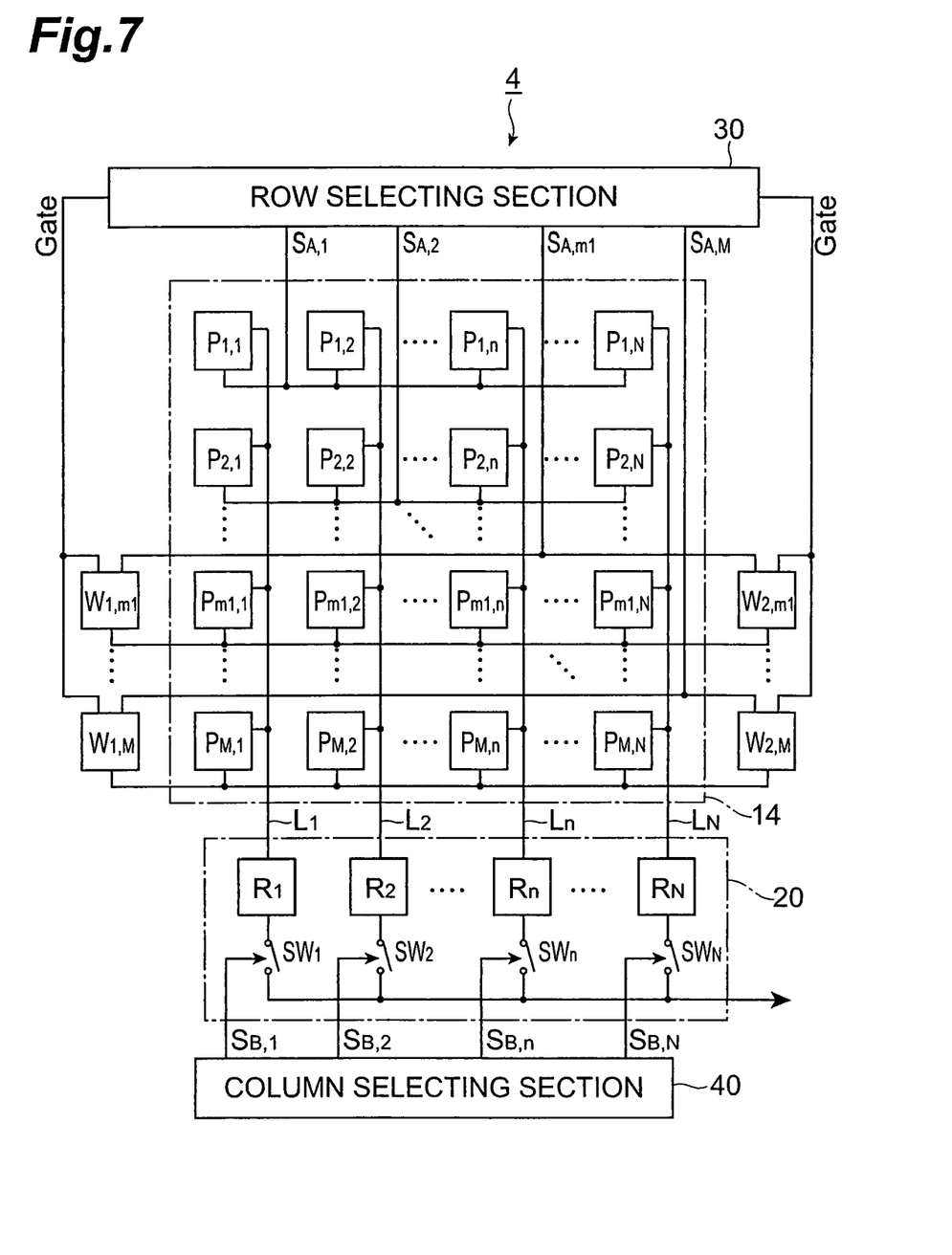
FIG. 7 is a diagram showing a configuration of a fourth embodiment of a solid-state image pickup apparatus according to the present invention.

Next, explanation will be given of a fourth embodiment of a solid-state image pickup apparatus according to the present invention. FIG. 7 is a diagram showing a configuration of a solid-state image pickup apparatus 4 according to the fourth embodiment. The solid-state image pickup apparatus 4 shown in this figure comprises a photodetecting section 14, an output section 20, a row selecting section 30, and a column selecting section 40.

In the solid-state image pickup apparatus 4 according to the fourth embodiment, each of the output section 20, row selecting section 30, and column selecting section 40 has the same components as those of the solid-state image pickup apparatus 1 according to the foregoing first embodiment.

Namely, in the solid-state image pickup apparatus 4 according to the fourth embodiment, the photodetecting section 14 has, similar to the photodetecting section 11 of the solid-state image pickup apparatus 1 according to the foregoing first embodiment, M×N pixels $P_{m,n}$ that are two-dimensionally arranged in M rows and N columns and each of which includes a photodiode and a cell switch, and N lines $L_N$ provided in accordance with the respective columns of the pixels such that the photodiodes in the M pixels $P_{1,n}$ to $P_{M,n}$ that constitute the nth column is connected to a common line $L_n$ via the cell switches in the pixels.

The solid-state image pickup apparatus 4 further comprises a smaller number than 2M of waveform shaping circuits $W_{1,1}$ to $W_{1,M}$ and $W_{2,1}$ to $W_{2,M}$ as waveform shaping means for shaping the waveforms of row selecting signals. Each waveform shaping circuit $W_{1,m}$ (here, m is an integer of m1 or more but M or less) is arranged at one end side in the pixel arrangement direction of the mth row of the photodetecting section 14, and each waveform shaping circuit $W_{2,m}$ is arranged at the other end side in the pixel arrangement direction of the mth row of the photodetecting section 14. The waveform shaping circuit $W_{1,m}$ and the waveform shaping circuit $W_{2,m}$ operate with identical timing. Each waveform shaping circuit $W_{1,m}$, $W_{2,m}$ shapes the waveform of the row selecting signal $S_{A,m}$ outputted from the row selecting section 30, and inputs a shaped row selecting signal $S'_{A,m}$ thereof into the cell switches in the N pixels $P_{m,1}$ to $P_{m,N}$ that constitute the mth row of the photodetecting section 14. Each waveform shaping circuit $W_{1,m}$, $W_{2,m}$ preferably includes a logic circuit that outputs a logic signal according to a level of the inputted row selecting signal $S_{A,m}$ as the waveform-shaped row selecting signal $S'_{A,m}$. In the fourth embodiment, the waveform shaping means for shaping the waveform of the row selecting signal $S_{A,m}$ outputted from the row selecting section 30 is thus provided only for each of the m1th row to the Mth row longer in distance from the row selecting section 30 than a predetermined distance out of the M rows of the photodetecting section 14.

The solid-state image pickup apparatus 4 according to the fourth embodiment operates almost the same as the solid-state image pickup apparatus 2 according to the foregoing second embodiment to provide the same effects. However, in the fourth embodiment, since the waveform shaping circuits are arranged, for each of the m1th row to the Mth row of the photodetecting section 14, at both sides in the pixel arrangement direction of the row, the waveform of the row selecting signal to be inputted into the cell switches in pixels results in a neater rectangular pulse waveform, and more accurate imaging results can thus be obtained.

(Modification)

The present invention is not limited to the embodiments described above and various modifications can be made.

Namely, although each waveform shaping circuits has been a logic circuit for outputting by a logical product (AND) operation in the above-described embodiments, it may be a logic circuit for outputting by a NOR operation, or may be another logical operation circuit.

Figure 8:
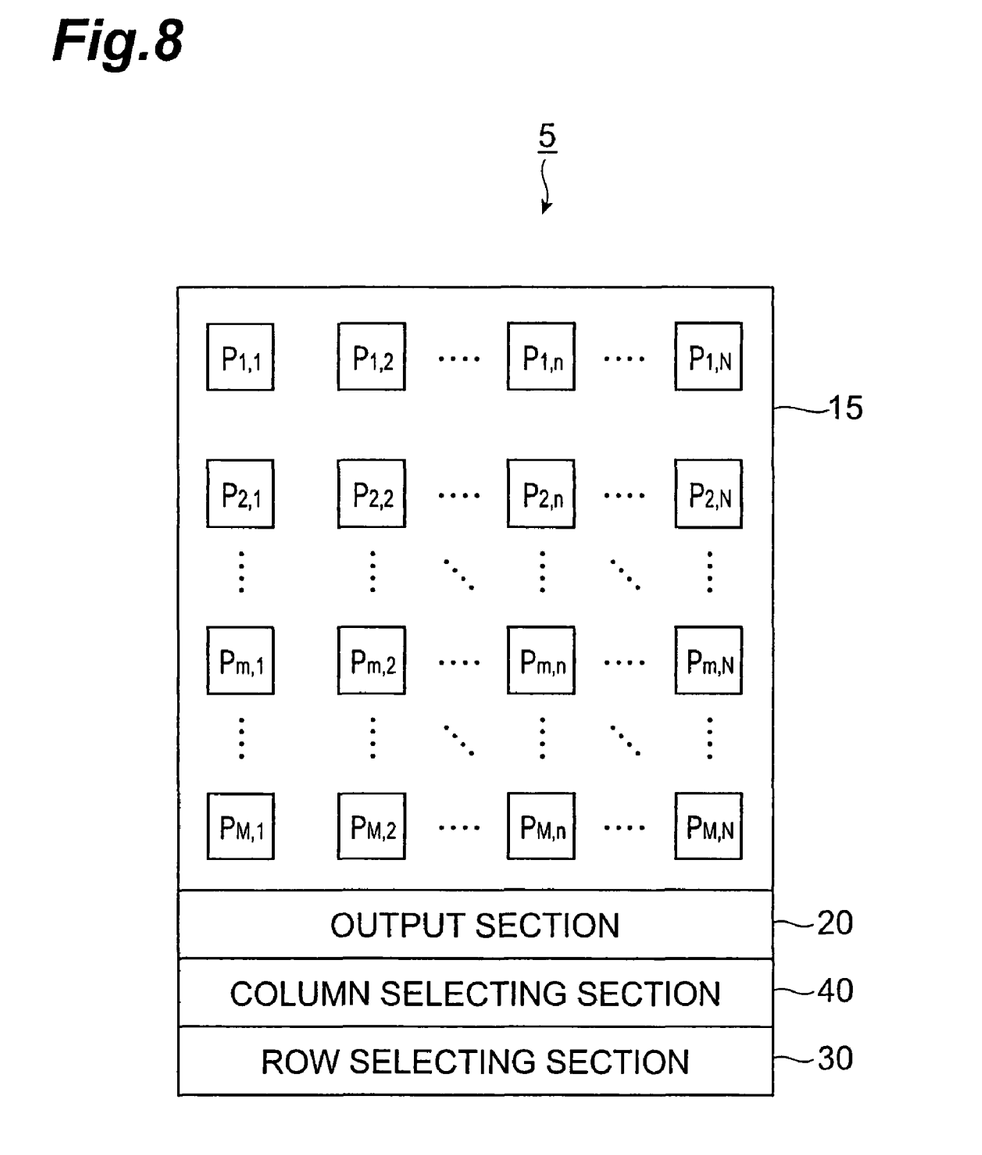
FIG. 8 is a diagram showing a schematic configuration of a modification of a solid-state image pickup apparatus according to the present invention.

For the solid-state image pickup apparatuses according to the embodiments described above, the row selecting section is arranged at the first-row side of the photodetecting section, and the output section and column selecting section are arranged at the Mth row side of the photodetecting section. However, the row selecting section, output section, and column selecting section may be each arranged at either the first-row side or the Mth-row side of the photodetecting section. For example, as a schematic configuration shown in FIG. 8, for a solid-state image pickup apparatus 5, the output section 20, row selecting section 30, and column selecting section 40 may be all arranged at the Mth row side of a photodetecting section 15. In FIG. 8, waveform shaping circuits, row selecting signal lines, column selecting signal lines, and gate signal selecting lines and the like are omitted.

In the schematic configuration shown in FIG. 8, the waveform shaping circuit may be provided for each of all rows of the photodetecting section, or may be provided for each of the rows longer in distance from the row selecting section 30 than a predetermined distance out of the M rows of the photodetecting section 15. In addition, the waveform shaping circuit may be arranged, for each row of the photodetecting section 15, at one end side in the pixel arrangement direction of the row, or may be arranged, for each row of the photodetecting section 15, at both end sides in the pixel arrangement direction of the row.

Figure 9:
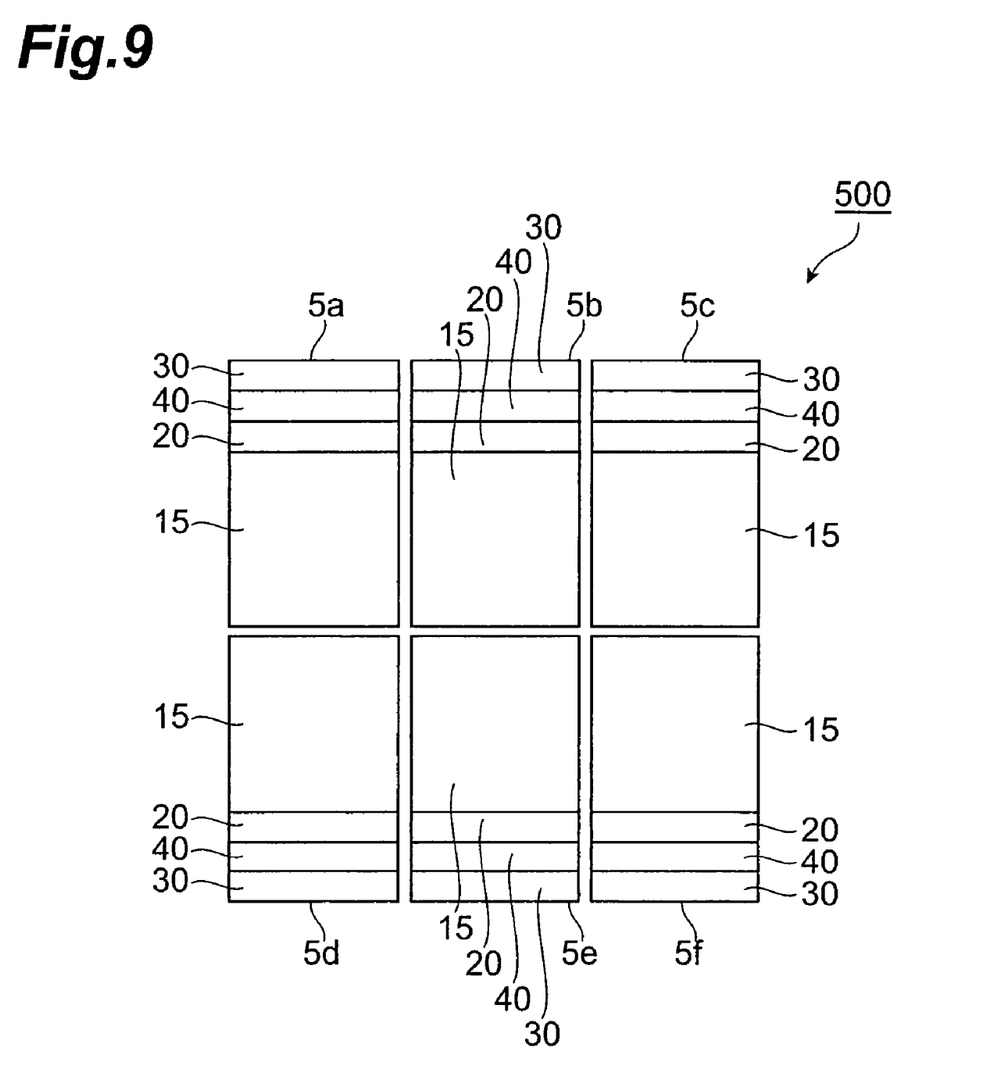
FIG. 9 is a diagram showing a configuration of a solid-state image pickup apparatus array in which a plurality of solid-state image pickup apparatuses 5a to 5f (each of which corresponds to a solid-state image pickup apparatus according to the present invention) are juxtaposed.

In addition, FIG. 9 is a configuration diagram of a solid-state image pickup apparatus array in which a plurality of solid-state image pickup apparatuses 5a to 5f are juxtaposed. Each of the solid-state image pickup apparatuses 5a to 5f is a solid-state image pickup apparatus having the same configuration as that of the foregoing solid-state image pickup apparatus 5. In this solid-state image pickup apparatus array 500, the solid-state image pickup apparatuses 5a to 5c are juxtaposed such that the pixels, which constitute the mth row of the photodetecting section 15 of each of the solid-state image pickup apparatuses 5a to 5c, are aligned in line. The solid-state image pickup apparatuses 5d to 5f are juxtaposed such that the pixels, which constitute the mth row of the photodetecting section 15 of each of the solid-state image pickup apparatuses 5d to 5f, are aligned in line. The first row of the photodetecting section 15 of the solid-state image pickup apparatus 5a and the first row of the photodetecting section 15 of the solid-state image pickup apparatus 5d are adjacent to each other. The first row of the photodetecting section 15 of the solid-state image pickup apparatus 5b and the first row of the photodetecting section 15 of the solid-state image pickup apparatus 5e are adjacent to each other. Moreover, the first row of the photodetecting section 15 of the solid-state image pickup apparatus 5c and the first row of the photodetecting section 15 of the solid-state image pickup apparatus 5f are adjacent to each other.

In the solid-state image pickup apparatuses 5a to 5f, since the output section 20, row selecting section 30, and column selecting section 40 are arranged at the Mth-row side of the photodetecting section 15, when the solid-state image pickup apparatuses 5a to 5f are juxtaposed as in the solid-state image pickup apparatus array 500, it is possible to reduce a non-sensitive region between the two adjacent solid-state image pickup apparatuses. Moreover, since the waveform shaping circuit is provided for each row so as to shape the waveform of the row selecting signal $S_{A,m}$ for selecting each row, more accurate imaging results can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The present invention relates to a solid-state image pickup apparatus with a photodetecting section in which a plurality of pixels each including a photodiode are two-dimensionally arranged in M rows and N columns. This allows, when being applied as an element of a solid-state image pickup array, to reduce a non-sensitive region between the adjacent devices, and can thus obtain more accurate imaging results.

The invention claimed is:

1. A solid-state image pickup apparatus, comprising:
a photodetecting section having a plurality of pixels which are two-dimensionally arranged in M rows and N columns (M and N are integers of two or more) and each of which includes a photodiode and a cell switch, and N lines $L_N$ provided in accordance with the respective columns of said pixels such that said associated photodiodes in said pixels that constitute the nth column (n is an arbitrary integer of one or more but N or less) are respectively connected to a line $L_n$ via said cell switch corresponding to said associated photodiode;
an output section which accumulates an electric charge that flows in through the line $L_n$ into a readout circuit $R_n$ and which outputs a voltage according to the amount of the accumulated electric charge from said readout circuit $R_n$ via a switch $SW_n$, said output section being arranged at a first-row side or an Mth-row side of said photodetecting section and including N readout circuits $R_1$ to $R_N$ and N switches $SW_1$ to $SW_N$;
a row selecting section having a first output terminal for outputting a row selecting signal $S_{A,m}$ for an instruction on switching of said cell switches in said pixels that constitute the mth row (m is an arbitrary integer of one or more but M or less) of said photodetecting section, and a second output terminal for outputting a gate signal for shaping the row selecting signal $S_{A,m}$, said row selecting section being arranged at a first-row side or an Mth-row side of said photodetecting section;
a column selecting section that outputs a column selecting signal $S_{B,n}$ for an instruction on switching of said switch $SW_n$ in said output section, said column selecting section being arranged at a first-row side or an Mth-row side of said photodetecting section; and
waveform shaping means for shaping, for each of the rows longer in distance from said row selecting section than a predetermined distance out of the M rows of said photodetecting section, a waveform of the row selecting signal $S_{A,m}$ outputted from said row selecting section and which inputs a shaped row selecting signal $S'_{A,m}$ into said cell switches of said pixels that constitute the mth row of said photodetecting section,
wherein said row selecting section is configured so as to be substantially parallel with said column selecting section, and
wherein said waveform shaping means $W_{1,m}$ has a first input terminal for inputting the row selecting signal $S_{A,m}$ and a second input terminal for inputting the associated gate signal, and shapes the row selecting signal $S_{A,m}$ in accordance with a timing of the associated gate signal provided as an input signal in said waveform shaping means $W_{1,m}$ while a length of a gate signal line through which the associated gate signal is provided is shorter than a length of a row selecting signal line through which the row selecting signal $S_{A,m}$ to be shaped is provided, the gate signal line disposed outside said photodetecting section and having one end directly connected to the second output terminal of said row selecting section and the other end directly connected to the second input terminal of said waveform shaping means $W_{1,m}$ the row selecting signal line having a portion disposed between the adjacent columns in said photodetecting section and having one end directly connected to the first output terminal of said row selecting section and the other end directly connected to the first input terminal of said waveform shaping means $W_{1,m}$.

2. A solid-state image pickup apparatus according to claim 1, wherein said waveform shaping means shapes, for each of all rows of said photodetecting section, a waveform of the row selecting signal $S_{A,m}$ outputted from said row selecting section, and inputs a shaped row selecting signal $S'_{A,m}$ into said cell switches of said pixels that constitute the mth row of said photodetecting section.

3. A solid-state image pickup apparatus according to claim 1, wherein said waveform shaping means is arranged, for each row of said photodetecting section, at either one end side of the row.

4. A solid-state image pickup apparatus according to claim 1, wherein said waveform shaping means is arranged, for each row of said photodetecting section, at both end sides of the row.

5. A solid-state image pickup apparatus according to claim 1, wherein said waveform shaping means includes a logic circuit that is inputted with the row selecting signal $S_{A,m}$ outputted from said row selecting section and that outputs a logic signal according to a level of the inputted row selecting signal $S_{A,m}$ as a waveform-shaped row selecting signal $S'_{A,m}$.

* * * * *